(12) United States Patent
Tsukuda et al.

(10) Patent No.: US 10,917,602 B2
(45) Date of Patent: Feb. 9, 2021

(54) STACKED IMAGING DEVICE WITH CU-CU BONDING PORTION

(71) Applicant: Sony Corporation, Tokyo (JP)

(72) Inventors: Yasunori Tsukuda, Kanagawa (JP); Kenichi Takamiya, Kanagawa (JP)

(73) Assignee: Sony Corporation, Tokyo (JP)

( * ) Notice: Subject to any disclaimer, the term of this patent is extended or adjusted under 35 U.S.C. 154(b) by 129 days.

(21) Appl. No.: 16/061,935

(22) PCT Filed: Dec. 8, 2016

(86) PCT No.: PCT/JP2016/086466
§ 371 (c)(1),
(2) Date: Jun. 13, 2018

(87) PCT Pub. No.: WO2017/110482
PCT Pub. Date: Jun. 29, 2017

(65) Prior Publication Data
US 2018/0376093 A1    Dec. 27, 2018

(30) Foreign Application Priority Data

Dec. 21, 2015 (JP) .................................. 2015-248480

(51) Int. Cl.
*H04N 5/369* (2011.01)
*H01L 27/146* (2006.01)
(Continued)

(52) U.S. Cl.
CPC ............. *H04N 5/379* (2018.08); *H01L 24/00* (2013.01); *H01L 25/167* (2013.01);
(Continued)

(58) Field of Classification Search
CPC ...... H04N 5/378; H04N 5/379; H01L 25/167; H01L 27/14612; H01L 27/14643;
(Continued)

(56) References Cited

U.S. PATENT DOCUMENTS

2005/0064892 A1    3/2005 Cavin
2012/0056251 A1*   3/2012 Kudoh .............. H01L 27/14623
                                              257/292
(Continued)

FOREIGN PATENT DOCUMENTS

CN    103515401 A    1/2014
CN    103545324 A    1/2014
(Continued)

OTHER PUBLICATIONS

International Search Report and Written Opinion dated Feb. 22, 2017 in connection with International Application No. PCT/JP2016/086466.
(Continued)

*Primary Examiner* — Jennifer D Bennett
(74) *Attorney, Agent, or Firm* — Wolf, Greenfield & Sacks, P.C.

(57) ABSTRACT

An imaging device comprising a pixel substrate including pixel element circuitry, a logic substrate including read circuitry configured to receive an output signal voltage from the pixel element circuitry, and electrically-conductive material arranged between the pixel substrate and the logic substrate, wherein the electrically-conductive material is configured to transfer at least one reference voltage from the logic substrate to the pixel substrate, wherein the electrically-conductive material comprises a Cu—Cu bonding portion.

17 Claims, 6 Drawing Sheets

(51) Int. Cl.
*H01L 23/00* (2006.01)
*H01L 25/16* (2006.01)
*H04N 5/378* (2011.01)

(52) U.S. Cl.
CPC .. *H01L 27/14612* (2013.01); *H01L 27/14634* (2013.01); *H01L 27/14643* (2013.01); *H04N 5/378* (2013.01); *H01L 24/13* (2013.01); *H01L 24/16* (2013.01); *H01L 24/81* (2013.01); *H01L 27/14609* (2013.01); *H01L 2224/13147* (2013.01); *H01L 2224/16145* (2013.01); *H01L 2224/81193* (2013.01); *H01L 2224/81895* (2013.01)

(58) Field of Classification Search
CPC ..... H01L 27/14634; H01L 2224/16145; H01L 2224/81895; H01L 2224/13147; H01L 24/13; H01L 27/14609; H01L 2224/81193; H01L 24/16; H01L 24/81; H01L 24/00
See application file for complete search history.

(56) References Cited

U.S. PATENT DOCUMENTS

| | | | |
|---|---|---|---|
| 2012/0120293 A1 | 5/2012 | Mabuchi | |
| 2013/0092820 A1 | 4/2013 | Takemoto | |
| 2013/0092822 A1* | 4/2013 | Ichikawa | H01L 27/14636 250/208.1 |
| 2013/0334638 A1* | 12/2013 | Chen | H01L 27/14634 257/432 |
| 2014/0015084 A1 | 1/2014 | Chen et al. | |
| 2016/0173803 A1* | 6/2016 | Fukuoka | H01L 27/14623 348/302 |
| 2016/0233264 A1 | 8/2016 | Kagawa et al. | |

FOREIGN PATENT DOCUMENTS

| | | | | |
|---|---|---|---|---|
| CN | 104064574 A | 9/2014 | | |
| JP | H04-340732 A | 11/1992 | | |
| JP | 2000-299379 A | 10/2000 | | |
| JP | 2009-170448 A | 7/2009 | | |
| JP | 2009170448 A * | 7/2009 | | H01L 27/1464 |
| JP | 2012-104684 A | 5/2012 | | |
| JP | 2012-244331 A | 12/2012 | | |
| JP | 2015-211259 A | 11/2015 | | |
| WO | WO 2015-019836 A1 | 2/2015 | | |
| WO | WO 2015-041279 A1 | 3/2015 | | |
| WO | WO 2015/050000 A1 | 4/2015 | | |

OTHER PUBLICATIONS

International Preliminary Report on Patentability dated Jul. 5, 2018 in connection with International Application No. PCT/JP2016/086466.

Chinese Office Action dated Apr. 7, 2020 in connection with Chinese Application No. 201680073463.8, and English translation thereof.

Japanese Office Action dated Dec. 24, 2019 in connection with Japanese Application No. 2015-248480 and English translation thereof.

* cited by examiner

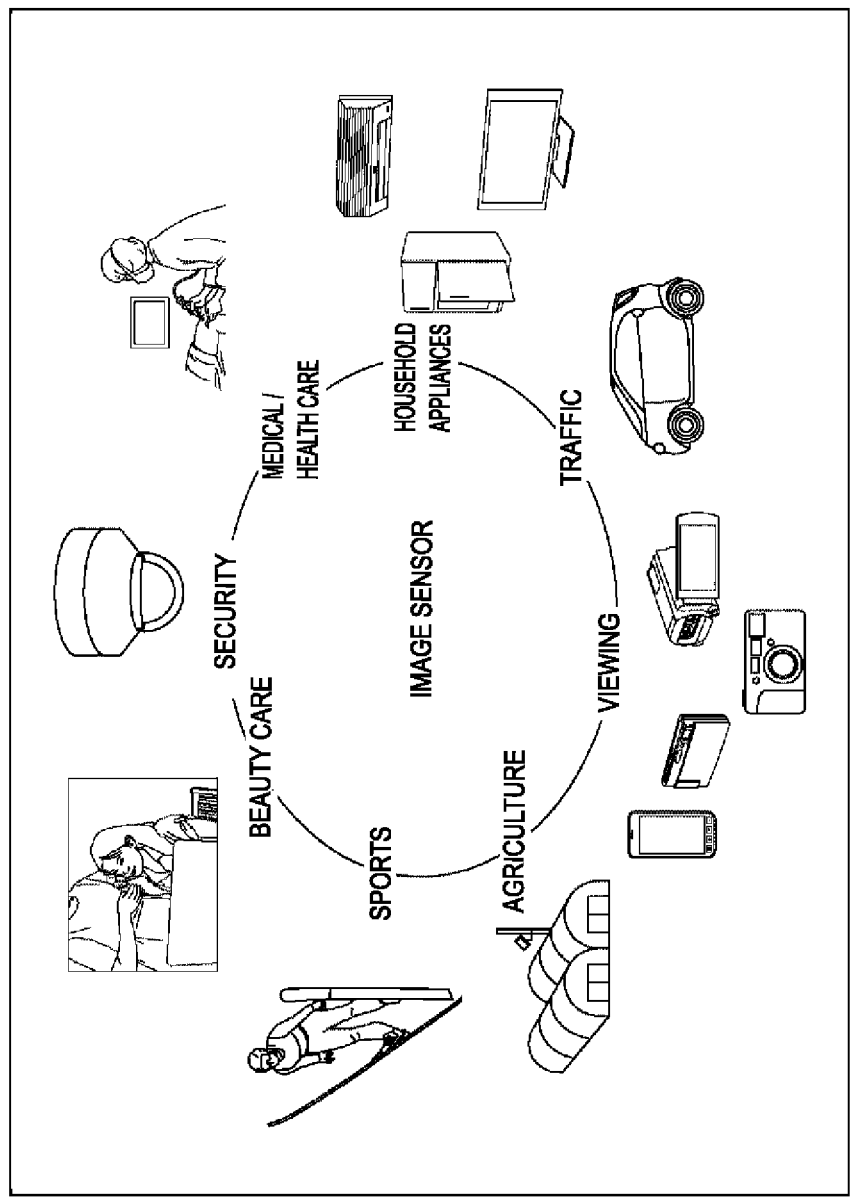

STACKED IMAGING DEVICE WITH CU-CU BONDING PORTION

CROSS REFERENCE TO RELATED APPLICATIONS

This application claims the benefit under 35 U.S.C. § 371 as a U.S. National Stage Entry of International Application No. PCT/JP2016/086466, filed in the Japanese Patent Office as a Receiving Office on Dec. 8, 2016, which claims priority to Japanese Patent Application No. JP 2015-248480, filed in the Japanese Patent Office on Dec. 21, 2015, each of which is hereby incorporated by reference in its entirety.

TECHNICAL FIELD

The present disclosure relates to a solid-state image pickup element and an electronic device, and in particular, to a solid-state image pickup element configured to have a plurality of laminated substrates, and an electronic device.

BACKGROUND ART

A configuration of a solid-state image pickup element known in the past is a lamination of a pixel substrate, in which pixels each including a photoelectric converting element such as a PD (photo diode) or the like are arranged vertically and horizontally, and a logic substrate, on which a circuit for reading an electric signal to be a pixel signal from the pixel substrate to conduct AD conversion and the like are mounted (see e.g. PTL 1).

The laminated pixel substrate and logic substrate are electrically connected by bringing into contact micro-bumps made of a conductive material which are formed on both the substrates or by forming TCV (silicon through electrode) passing through both the substrates, so that a pixel signal and the like are communicated through the micro-bumps or the TCV.

CITATION LIST

Patent Literature

PTL 1: JP 2012-244331 A

SUMMARY OF INVENTION

Technical Problem

When micro-bumps are used for electrical connection between laminated substrates, because of a large cross-sectional area thereof (e.g. on the order of 15×15 μm), an area of the micro-bumps occupying the substrates is increased to hinder miniaturization of a pixel or reduction in size of a solid-state image pickup element. Additionally, since an additional space for the micro-bumps is provided between the laminated substrates, capacitive coupling between the substrates is lessened to reduce an effect obtained when wires of the laminated substrates are used as decoupling capacitance.

When a TCV is used for electrical connection between laminated substrates, because arrangement of the TCV is limited, due to a structure thereof, to a position in which no photoelectric converting element such as a PD is arranged, a parasitic resistance might not be ignored. Therefore, the connected substrates might not be considered as the same node.

The present disclosure, which has been made in view of such circumstances, recognizes a need for establishing electrical connection between substrates while saving an area without causing a parasitic resistance, when a plurality of substrates is laminated.

Solution to Problem

In some embodiments, an imaging device may comprise a pixel substrate including pixel element circuitry, a logic substrate including read circuitry configured to receive an output signal voltage from the pixel element circuitry, and electrically-conductive material arranged between the pixel substrate and the logic substrate, wherein the electrically-conductive material is configured to transfer at least one reference voltage from the logic substrate to the pixel substrate, wherein the electrically-conductive material comprises a Cu—Cu bonding portion.

Advantageous Effects of Invention

According to the first and second aspects of the present disclosure, when laminating a plurality of substrates, electrical connection can be established between the substrates while saving an area without causing a parasitic resistance.

BRIEF DESCRIPTION OF DRAWINGS

FIG. 6 is a diagram showing an example of use of an electronic device to which the present disclosure is applied.

DESCRIPTION OF EMBODIMENTS

In the following, detailed description will be made with respect to a best mode for carrying out the present disclosure (hereinafter, referred to as an "embodiment") with reference to the drawings.

Figure 1:
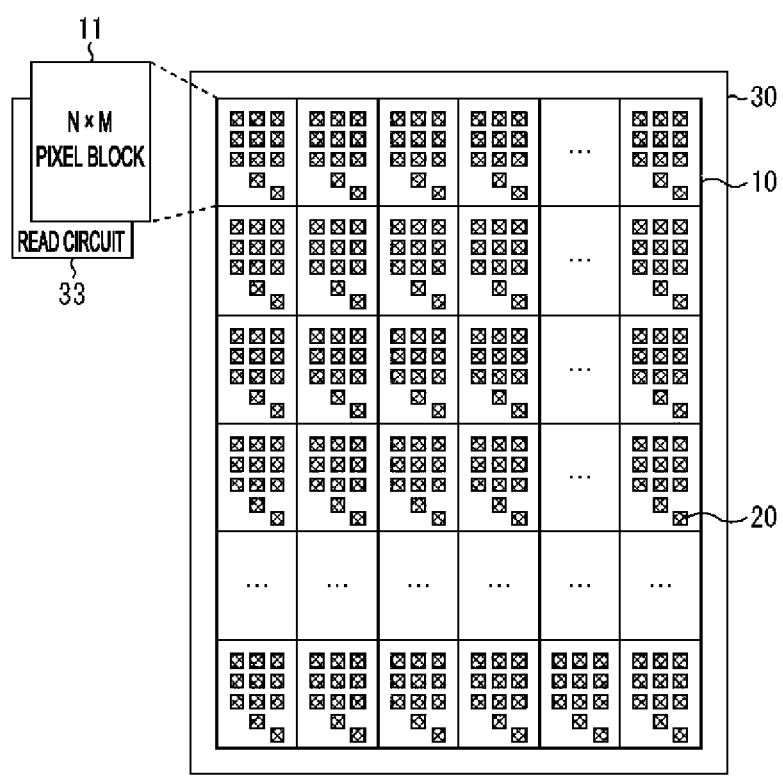
FIG. 1 is a top view of a solid-state image pickup element to which the present disclosure is applied.

Configuration Examples of Solid-State Image Pickup Element as Embodiments of the Present Disclosure FIG. 1 is a top view showing a configuration example of a solid-state image pickup element as an embodiment of the present disclosure.

The solid-state image pickup element is configured to have a lamination of a pixel substrate 10 and a logic substrate 30, in which wiring metals (e.g. Cu) arranged in uppermost layers thereof are connected to each other to form a Cu—Cu bonding portion 20, thereby electrically connecting both the substrates. An area occupied by the Cu—Cu bonding portion 20 (e.g. on the order of 2×2 μm) is narrower than an area to be provided for a micro-bump (e.g. on the order of 15×15 μm).

Note that a wiring metal arranged in each of the uppermost layers of the pixel substrate 10 and the logic substrate 30 is not limited to Cu and, for example, a conductive material such Au may be used. In such a case, an Au—Au bonding portion is used in place of the Cu—Cu bonding portion 20.

On the pixel substrate 10, a plurality of pixel blocks 11 formed of N×M pixels is arranged. On the logic substrate 30, corresponding to each pixel block 11 of the pixel substrate 10, one read circuit 33 (FIG. 2) for reading a pixel signal from the N×M pixels of the pixel block 11, and the like are arranged.

First Configuration Example of Solid-State Image Pickup Element

Figure 2:
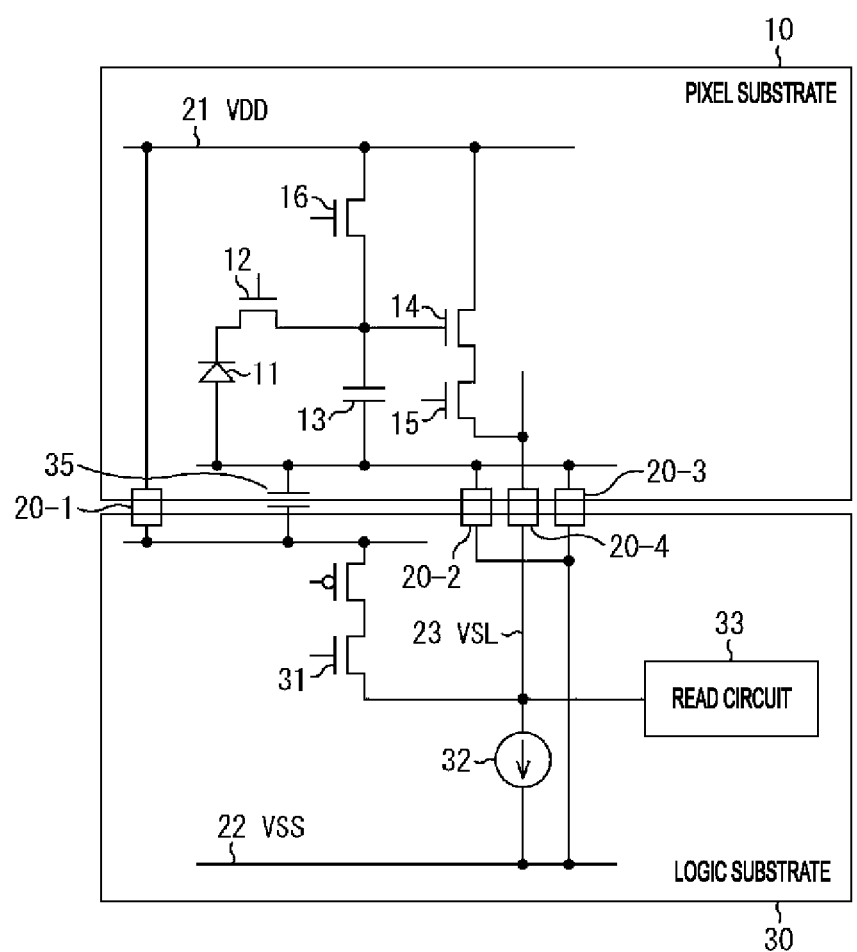
FIG. 2 is a circuit diagram showing a first configuration example of the solid-state image pickup element.

FIG. 2 is a circuit diagram showing a first configuration example of the solid-state image pickup element. In the pixel substrate 10 in the figure, a circuit configuration of only one pixel is shown and, in a logic substrate 30, a circuit configuration corresponding to the pixel block 11 on the pixel substrate 10 is shown.

Formed as a circuit configuration of one pixel in the pixel substrate 10 are a PD 11, a TG transistor 12, an FD (floating diffusion) 13, an AMP transistor 14, a SEL transistor 15 and a RST transistor 16.

The PD 11 is one example of a photoelectric converting element and generates and accumulates electric charges according to an incident light by photoelectric conversion. The PD 11 has an anode connected to a VSS (ground wire) 22 and a cathode connected to a source of the TG transistor 12. Here, the VSS 22 is assumed to represent a wire to which a voltage is applied from outside of both the substrates and from which a current flows out evenly in an operation state.

The TG transistor 12 is a transistor for transferring the electric charges accumulated in the PD 11 to the FD (floating diffusion) 13. The TG transistor 12 has the source connected to the cathode of the PD 11 and a drain connected to a gate of the AMP transistor 14 via the FD 13. The FD 13 converts an electric charge transferred from the PD 11 into a voltage.

The AMP transistor 14 is a transistor which functions as a source follower of the pixel substrate 10 using a voltage of the FD 13 as an input. The AMP transistor 14 has the gate connected to the FD 13 and a drain connected to a VDD (power source wire) 21. Additionally, a source of the AMP transistor 14 is connected to a drain of the SEL transistor 15. Here, the VDD 21 is assumed to represent a wire to which a voltage is applied from outside of both the substrates and into which a current flows evenly in the operation state.

The SEL transistor 15 is a transistor for selecting an output of an electric signal (voltage) to a vertical signal line (VSL) 23. A source of the SEL transistor 15 is connected to the VSL 23.

The RST transistor 16 is a transistor for resetting electric charges (voltage (potential)) accumulated in the FD 13. The RST transistor 16 has a drain connected to the VDD 21 and a source connected to the FD 13.

On the other hand, on the logic substrate 30, a transistor 31, a VSL driving current power source 32 and the read circuit 33 are formed.

The transistor 31 is a source follower of the logic substrate 30 and operates as a clamp circuit which prevents the VSL 23 from having too low a potential. In the following, the transistor will be also referred to as a clamp circuit 31.

The read circuit 33 is arranged immediately below a Cu—Cu bonding portion 20-4 and is connected to the VSL 23, reads an electric signal also as a pixel signal from the pixel substrate 10 to conduct AD conversion thereof, and outputs a result thereof to a subsequent stage.

The VDD 21 between both the pixel substrate 10 and the logic substrate 30 is connected via a Cu—Cu bonding portion 20-1. Additionally, the VSS 22 between both the substrates is connected via Cu—Cu bonding portions 20-2 and 20-3. Further, the VSL 23 between both the substrates is connected via the Cu—Cu bonding portion 20-4.

Since the Cu—Cu bonding portion 20-4 is surrounded by the Cu—Cu bonding portions 20-2 and 20-3 which connect the VSS 22 between both the substrates, the VSL 23 between both the substrates can be considered to be shielded by the VSS 22. By surrounding the Cu—Cu bonding portion 20-4 by a plurality of Cu—Cu bonding portions 20-1 which connects the VDD 21 between both the substrates, the VSL 23 between both the substrates may be shielded by the VDD 21, although such a configuration is not illustrated.

It is assumed that a part of the VSS 22 in the pixel substrate 10 and a part of the VDD 21 in the logic substrate 30 run in parallel to each other in the vicinity of the Cu—Cu bonding portion 20. Alternatively, at least one of the VDD 21 and the VSS 22 may be wired in directions orthogonal to each other on both the substrates, although such a configuration is not illustrated.

Function of First Configuration Example of Solid-State Image Pickup Element

In the first configuration example, when a potential converted from electric charges by the FD 13 is excessively high, a sudden voltage drop not allowable for the VSL 23 could occur. Then, when the source follower (clamp circuit 31) of the logic substrate 30 operates for preventing such a situation, because no current is supplied by the source follower (AMP transistor 14) of the pixel substrate 10, a voltage drops to result in conversely increasing a voltage drop of the logic substrate 30. In such a condition, the read circuit 33 connected to the VSL 23 is affected by the voltage drop, resulting in outputting an AD conversion result with a difference from an AD conversion result to be originally output.

In the first configuration example, however, the Cu—Cu bonding portion 20-4 arranged above the read circuit 33 causes a function of averaging a voltage fluctuation between the substrates by a high frequency characteristic, so that a difference in an output of the read circuit 33, which is caused due to a variation in the amount of a voltage drop, can be suppressed.

Shielding the VSL 23 between both the substrates by the VSS 22 enables the VSL 23 to prevent mutual interference due to coupling through capacitances of an adjacent VSL or other nearby signal lines.

Because a part of the VSS 22 in the pixel substrate 10 and a part of the VDD 21 in the logic substrate 30 run in parallel to each other in the vicinity of the Cu—Cu bonding portion 20, a frequency characteristic of a decoupling capacitance 35, which is formed of a parasitic capacitance between the VSS 22 and the VDD 21 running in parallel to each other between both the substrates, can be satisfactorily maintained to a high frequency. This enables improvement of power source noise resistances of both the substrates.

The VDD 21 between both the substrates is connected by the Cu—Cu bonding portion 20-1. Therefore, even when a wiring width on the side of the pixel substrate 10 is not enough, necessary currents can be supplied at low impedance by arranging multi-layered wiring on the side of the logic substrate 30 on which multi-layered wiring can be easily arranged.

Second Configuration Example of Solid-State Image Pickup Element

Figure 3:
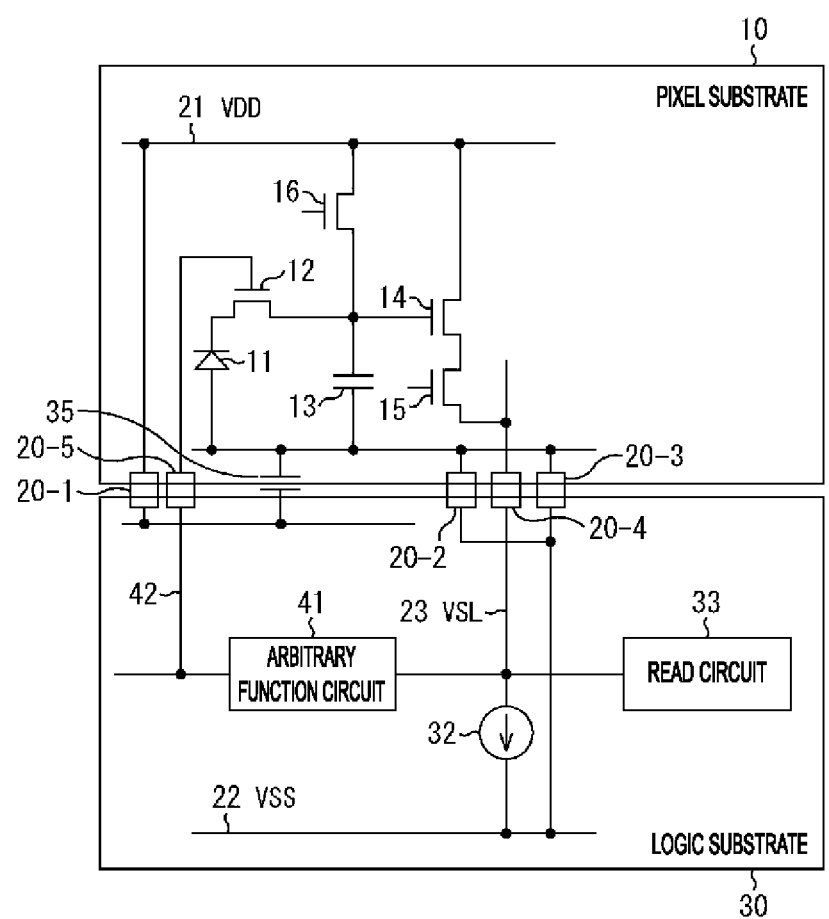
FIG. 3 is a circuit diagram showing a second configuration example of the solid-state image pickup element.

FIG. 3 is a circuit diagram showing a second configuration example of the solid-state image pickup element. In the pixel substrate 10 in the figure, a circuit configuration of only one pixel is shown and in the logic substrate 30, a circuit configuration corresponding to the pixel block 11 on the pixel substrate 10 is shown. Additionally, components common to those of the first configuration example shown in FIG. 2 are identified by the same reference characters to appropriately omit description thereof.

In the pixel substrate 10 in the second configuration example, formed as a circuit configuration of one pixel are the PD 11, the TG transistor 12, the FD 13, the AMP transistor 14, the SEL transistor 15 and the RST transistor 16.

To a gate of the TG transistor 12, a pixel control wire 42 is connected.

On the other hand, formed in the logic substrate 30 are the VSL driving current power source 32, the read circuit 33 and an arbitrary function circuit 41.

To the arbitrary function circuit 41, the pixel control wire 42 is connected to, for example, generate a pixel control signal which controls exposure timing of each pixel and supply the same to the gate of the TG transistor 12 via the pixel control wire 42.

The VDD 21 between both the substrates of the pixel substrate 10 and the logic substrate 30 is connected via the Cu—Cu bonding portion 20-1. Additionally, the VSS 22 between both the substrates is connected via the Cu—Cu bonding portions 20-2 and 20-3. Further, the VSL 23 between both the substrates is connected via the Cu—Cu bonding portion 20-4. Still further, the pixel control wire 42 between both the substrates is connected via a Cu—Cu bonding portion 20-5.

Function of Second Configuration Example of Solid-State Image Pickup Element When simultaneity is sought in operation of circuits on the pixel substrate 10 and operation of circuits on the logic substrate 30, an arrival delay or an error of a pixel control signal due to a variation in a parasitic RC which could be generated in the pixel control wire 42 may be of concern. In a case of the second configuration example, since a non-common wiring part is so short that a delay error can be ignored, operation which may require a timing constraint such as simultaneity is enabled.

In the second configuration example, supplying the pixel control signal for each pixel block 11 by using multi-layered wiring on the side of the logic substrate 30 enables complicated pixel control.

Shielding the VSL 23 between both the substrates by the VSS 22 enables the VSL 23 to prevent mutual interference due to coupling through capacitances of an adjacent VSL or other nearby signal lines.

Because a part of the VSS 22 in the pixel substrate 10 and a part of the VDD 21 in the logic substrate 30 run in parallel to each other in the vicinity of the Cu—Cu bonding portion 20, a frequency characteristic of the decoupling capacitance 35, which is formed of a parasitic capacitance between the VSS 22 and the VDD 21 running in parallel to each other between both the substrates, can be satisfactorily maintained to a high frequency. This enables improvement of power source noise resistances of both the substrates.

The VDD 21 between both the substrates is connected by the Cu—Cu bonding portion 20-1. Therefore, even when a wiring width on the side of the pixel substrate 10 is not enough, necessary currents can be supplied at low impedance by arranging multi-layered wiring on the side of the logic substrate 30 on which multi-layered wiring can be easily arranged.

Third Configuration Example of Solid-State Image Pickup Element

Figure 4:
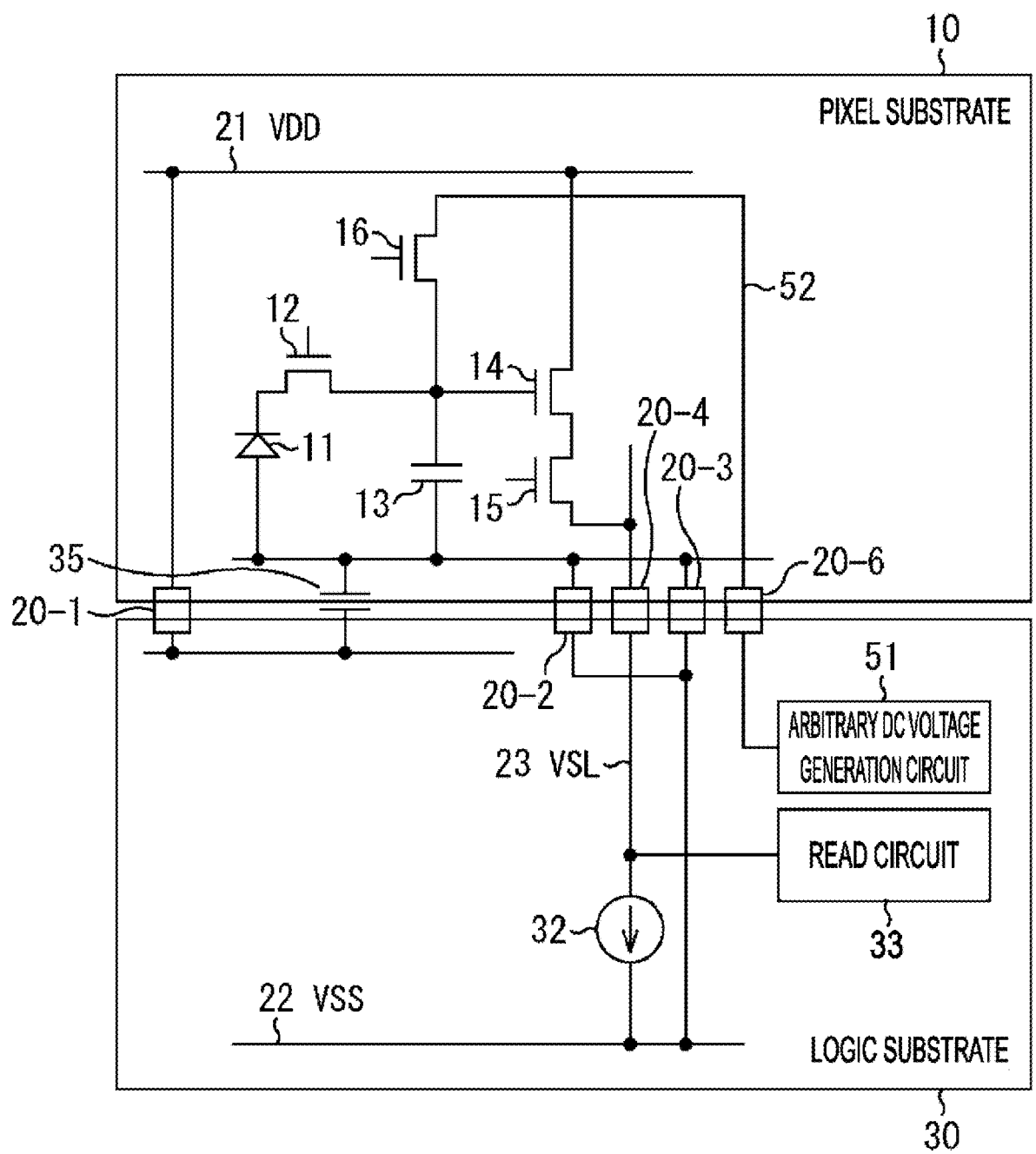
FIG. 4 is a circuit diagram showing a third configuration example of the solid-state image pickup element.

FIG. 4 is a circuit diagram showing a third configuration example of the solid-state image pickup element. In the pixel substrate 10 in the figure, a circuit configuration of only one pixel is shown and in the logic substrate 30, a circuit configuration corresponding to the pixel block 11 on the pixel substrate 10 is shown. Additionally, components common to those of the first configuration example shown in FIG. 2 are identified by the same reference characters to appropriately omit description thereof.

In the pixel substrate 10 in the third configuration example, formed as a circuit configuration of one pixel are the PD 11, the TG transistor 12, the FD 13, the AMP transistor 14, the SEL transistor 15 and the RST transistor 16.

The RST transistor 16 in the second configuration example has the drain connected to a FD initialization voltage wire 52 and has the source connected to the FD 13.

On the other hand, formed in the logic substrate 30 are the VSL driving current power source 32, the read circuit 33 and an arbitrary DC voltage generation circuit 51.

The arbitrary DC voltage generation circuit 51 is connected to the FD initialization voltage wire 52 to supply an arbitrary FD initialization voltage to the drain of the RST transistor 16.

The VDD 21 between both the substrates of the pixel substrate 10 and the logic substrate 30 is connected via the Cu—Cu bonding portion 20-1. Additionally, the VSS 22 between both the substrates is connected via the Cu—Cu bonding portions 20-2 and 20-3. Further, the VSL 23 between both the substrates is connected via the Cu—Cu bonding portion 20-4. Still further, the FD initialization voltage wire 52 between both the substrates is connected via a Cu—Cu bonding portion 20-6.

Function of Third Configuration Example of Solid-State Image Pickup Element

In the third configuration example, the arbitrary DC voltage generation circuit 51 of the logic substrate 30 is capable of generating the FD initialization voltage according to a variation in characteristics of each pixel block 11. This enables cancellation of variations in characteristics of each pixel block 11, thereby suppressing variations in image pickup characteristics among the pixels at the time of reading. Since the logic substrate 30 has less constraint on usable elements as compared with the pixel substrate 10, a circuit which executes more complicated control can be formed.

Shielding the VSL 23 between both the substrates by the VSS 22 enables the VSL 23 to prevent mutual interference due to coupling through capacitances of an adjacent VSL or other nearby signal lines.

Because a part of the VSS 22 in the pixel substrate 10 and a part of the VDD 21 in the logic substrate 30 run in parallel to each other in the vicinity of the Cu—Cu bonding portion 20, a frequency characteristic of the decoupling capacitance

35, which is formed of a parasitic capacitance between the VSS 22 and the VDD 21 running in parallel to each other between both the substrates, can be satisfactorily maintained to a high frequency. This enables improvement of power source noise resistances of both the substrates.

The VDD 21 between both the substrates is connected by the Cu—Cu bonding portion 20-1. Therefore, even when a wiring width on the side of the pixel substrate 10 is not enough, necessary currents can be supplied at low impedance by arranging multi-layered wiring on the side of the logic substrate 30 on which multi-layered wiring can be easily arranged.

Bonding Example of Cu—Cu Bonding Portion 20

Figure 5:
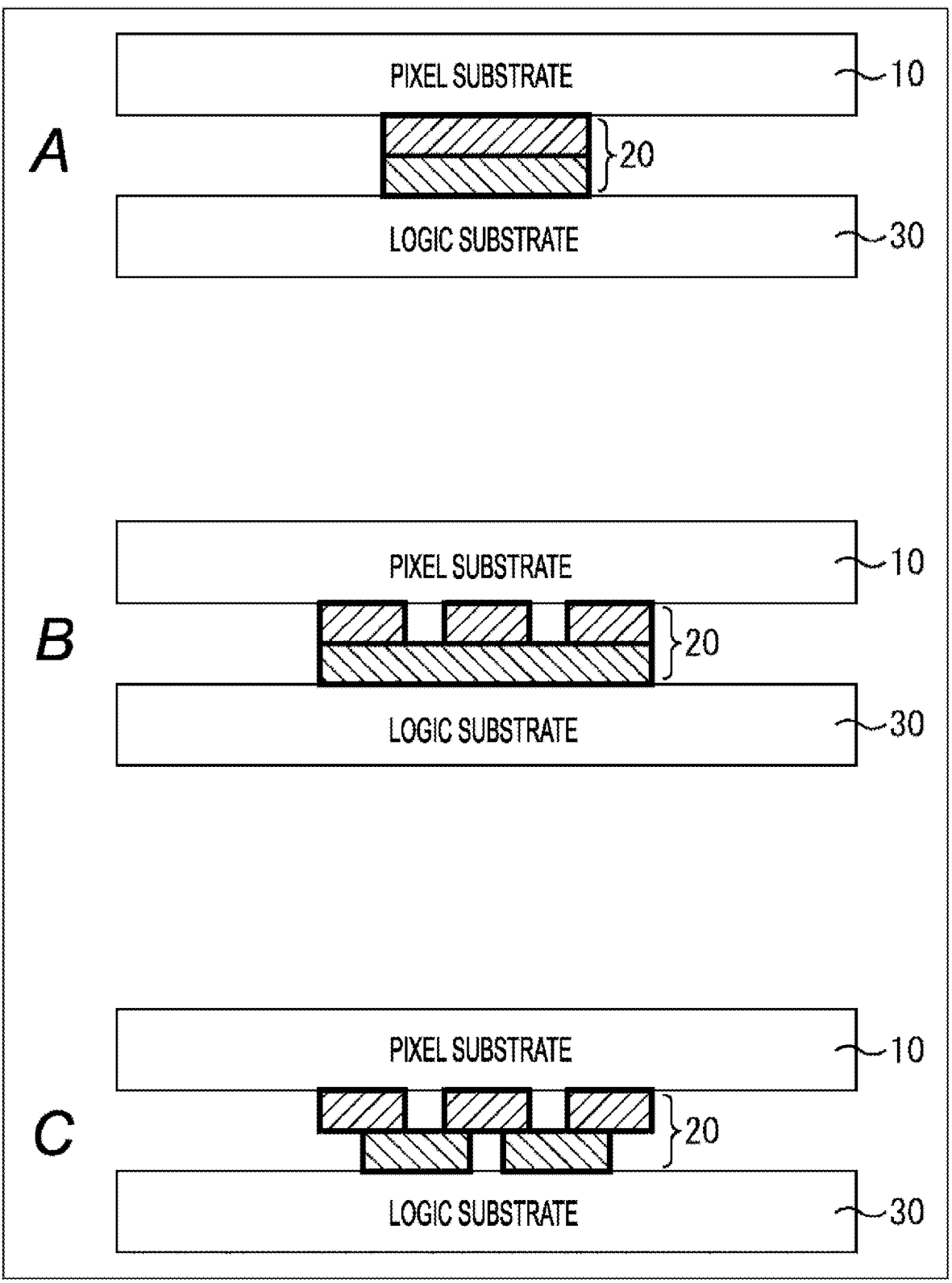
FIG. 5 is a view showing a connection example of a Cu—Cu bonding portion.

Next, FIG. 5 shows an example of bonding of the Cu—Cu bonding portion 20 which connects wires such as the VDD 21, the VSS 22, the VSL 23, the pixel control wire 42 or the FD initialization voltage wire 52 between both the substrates of the pixel substrate 10 and the logic substrate 30.

FIG. 5A shows a case where uppermost layer metals (Cu, in a case of the present embodiment) of both the substrates are bonded at a ratio of 1:1. FIG. 5B shows a case where the uppermost layer metals of both the substrates are bonded at a ratio of a plural number (3, in this case):1. The number of bonding portions on the pixel substrate 10 may be one and the number of bonding portions on the logic substrate 30 may be plural. FIG. 5C shows a case where the uppermost layers on both the substrates are bonded at a ratio of a plural number:a plural number (3:2, in this case). The number of bonding portions of both the substrates can be the same plural number (e.g. 3:3).

Bonding of the Cu—Cu bonding portion 20 can adopt any of the bonding examples of FIGS. 5A to 5C. Additionally, the bonding examples of FIGS. 5A to 5C may coexist in the same substrate.

Modification Example

The above described first to third configuration examples of the solid-state image pickup element can be arbitrarily combined, illustration of which is not included.

Additionally, the present disclosure is applicable not only to a solid-state image pickup element but also to an electronic component or an electronic device in which a plurality of substrates is laminated to securely provide electrical connection between the substrates.

Example of Use of Solid-State Image Pickup Element

FIG. 6 is a diagram showing an example of use of the solid-state image pickup element as the present embodiment.

The solid-state image pickup element can be used, for example, in the following various cases of sensing light such as visible light, infrared light, ultraviolet light, X-rays or the like.

Devices for photographing images for viewing, such as a digital camera, a portable equipment with a camera function, and the like.

Devices for traffic use, such as a vehicle-mounting sensor which photographs the front and rear, surroundings and the inside of a car or the like for the purpose of safety driving such as automatic stop, and for the purpose of recognition of a driver's condition, a monitoring camera which monitors traveling vehicles and roads, a distance sensor which measures a distance between vehicles, and the like.

Devices for use in such household appliances as a TV set, a refrigerator, an air conditioner and the like for the purpose of photographing a user's gesture to conduct equipment operation according to the gesture.

Devices for medical/health care, such as an endoscope, a device which conducts blood vessel photographing with a received infrared light, and the like.

Devices for security use such as a monitoring camera for crime prevention, a camera for person identification, and the like.

Devices for beauty care such as a skin sensor for photographing a skin, a microscope for photographing a scalp, and the like.

Devices for sports use such as an action camera, a wearable camera and the like for use in sports.

Devices for agricultural use such as a camera for monitoring conditions of fields and farm products, and the like.

Note that the embodiment of the present disclosure is not limited to the above-described embodiments and various modifications may be made without departing from the scope of the present disclosure.

Some embodiments of the present disclosure can take the following configurations.

An imaging device may comprise a pixel substrate including pixel element circuitry, a logic substrate including read circuitry configured to receive an output signal voltage from the pixel element circuitry, and electrically-conductive material arranged between the pixel substrate and the logic substrate, wherein the electrically-conductive material is configured to transfer at least one reference voltage from the logic substrate to the pixel substrate, wherein the electrically-conductive material comprises a Cu—Cu bonding portion.

The Cu—Cu bonding portion may comprise a first Cu—Cu bonding element configured to transfer a first reference voltage and a second Cu—Cu bonding element configured to transfer the output signal voltage from the pixel substrate to the logic substrate.

The Cu—Cu bonding portion may comprise a third Cu—Cu bonding element configured to transfer a second reference voltage.

The Cu—Cu bonding portion may comprises a fourth Cu—Cu bonding element configured to transfer the second reference voltage, and the second Cu—Cu bonding element may be arranged between the third Cu—Cu bonding element and the fourth Cu—Cu bonding element.

The second Cu—Cu bonding element may be coupled to an analog-digital converter and a part of the analog-digital converter may overlap a part of the pixel element circuitry.

The read circuitry may be arranged below the second Cu—Cu bonding element.

The Cu—Cu bonding portion may comprise a fifth Cu—Cu bonding element and the logic substrate may further include pixel driving circuitry configured to provide a pixel driving voltage to a gate of a transfer transistor of the pixel element circuitry via the fifth Cu—Cu bonding element.

The pixel driving circuitry may be configured to provide the pixel driving voltage to control an exposure timing of at least one pixel in the pixel element circuitry.

The Cu—Cu bonding portion may comprise a sixth Cu—Cu bonding element and the logic substrate may further include reset voltage generation circuitry configured to provide a reset voltage to a gate of a reset transistor of the pixel element circuitry via the sixth Cu—Cu bonding element.

The Cu—Cu bonding portion may be formed in an area of less than 15 μm×15 μm.

The Cu—Cu bonding portion may be formed in an area of approximately 2 μm×2 μm.

The Cu—Cu bonding portion may be configured to bond the pixel substrate to the logic substrate at a ratio of N:M, where N is a number of bonds electrically connected to the pixel substrate and M is a number of bonds electrically connected to the logic substrate.

In one embodiment, N=1 and M=1. In another embodiment, N=1 and M>1. In another embodiment, N>1 and M>1.

The logic substrate may further include a vertical signal line arranged to receive the output signal voltage from the pixel element circuitry and clamp circuitry configured to control a voltage on the vertical signal line.

The electrically-conductive material may comprises a Au—Au bonding portion.

A first portion of the electrically-conductive material may be configured to transfer a voltage from the pixel substrate to the logic substrate and a second portion of the electrically-conductive material may be configured to transfer a voltage from the logic substrate to the pixel substrate.

The pixel substrate may comprises a first wiring layer formed near a lower surface of the pixel substrate, the logic substrate may comprise a second wiring layer formed near an upper surface of the logic substrate, and the electrically-conductive material may be configured to electrically connect at least a portion of the first wiring layer and the second wiring layer.

The pixel element circuitry may include a plurality of N×M pixel blocks, and the electrically-conductive material may comprise a plurality of bonding points, each of which is configured to transfer at least one reference voltage from the logic substrate to each of the plurality of N×M pixel blocks.

(1)

A solid-state image pickup element including:

a pixel substrate in which a plurality of pixels each including a photoelectric converting element is arranged vertically and horizontally, a logic substrate which is laminated on the pixel substrate and reads an electric signal, which is to be a pixel signal, from the pixel substrate to conduct predetermined processing, and a bonding portion in which uppermost layer metals respectively of the pixel substrate and the logic substrate are bonded to electrically connect the pixel substrate and the logic substrate, wherein the pixel substrate is sectioned into pixel blocks by a predetermined number of pixels, and the bonding portion has at least one of a first bonding point which connects a power source wire and a second bonding point which connects a ground wire, between the pixel block and a region of the logic substrate corresponding to the pixel block.

(2)

The solid-state image pickup element according to (1), wherein the bonding portion further has one or a plurality of third bonding points which connects a predetermined signal wire between the pixel block and the region of the logic substrate corresponding to the pixel block.

(3)

The solid-state image pickup element according to (2), wherein the predetermined signal wire in the bonding portion is shielded by at least one of the power source wire and the ground wire.

(4)

The solid-state image pickup element according to any of (1) to (3), wherein, at the first to third bonding points, uppermost layer metals respectively of the pixel substrate and the logic substrate are bonded at a ratio of one-to-one, one-to-plural, plural-to-one or plural-to-plural.

(5)

The solid-state image pickup element according to any of (1) to (4), wherein the uppermost layer metal is Cu.

(6)

The solid-state image pickup element according to any of (1) to (5), wherein one of the power source wire and the ground wire in the pixel substrate and the other of the power source wire and the ground wire in the logic substrate are arranged to run partially in parallel to each other.

(7)

The solid-state image pickup element according to any of (2) to (6), wherein the logic substrate includes a read unit which reads an electric signal, which is to be a pixel signal, from the pixel substrate through a vertical signal line as the predetermined signal wire to conduct AD conversion.

(8)

The solid-state image pickup element according to (7), wherein, in the logic substrate, the read unit is formed in each the pixel block of the pixel substrate.

(9)

The solid-state image pickup element according to any of (1) to (8), wherein the logic substrate includes a pixel control unit which generates a pixel control signal that controls timing of transferring electric charges of the photoelectric converting element and which outputs the pixel control signal generated to the pixel substrate via a pixel control wire, and the bonding portion further has a fourth bonding point which connects the pixel control wire between the pixel block and the region of the logic substrate corresponding to the pixel block.

(10)

The solid-state image pickup element according to any of (1) to (9), wherein the logic substrate includes a voltage generation unit which generates a FD initialization voltage for initializing a FD on the pixel substrate and outputs the generated FD initialization voltage to the pixel substrate via a FD initialization voltage wire, and the bonding portion further has a fifth bonding point which connects the FD initialization voltage wire between the pixel block and the region of the logic substrate corresponding to the pixel block.

(11)

An electronic device on which a solid-state image pickup element is mounted, the solid-state image pickup element including:

a pixel substrate in which a plurality of pixels each including a photoelectric converting element is arranged vertically and horizontally, a logic substrate which is laminated on the pixel substrate and reads an electric signal, which is to be a pixel signal, from the pixel substrate to conduct predetermined processing, and a bonding portion in which uppermost layer metals respectively of the pixel substrate and the logic substrate are bonded to electrically connect the pixel substrate and the logic substrate, wherein the pixel substrate is sectioned into pixel blocks by a predetermined number of pixels, and the bonding portion has at least one of a first bonding point which connects a power source wire and a second bonding point which connects a ground wire, between the pixel block and a region of the logic substrate corresponding to the pixel block.

REFERENCE SIGNS LIST

10 Pixel substrate
11 Pixel block
20 Cu—Cu bonding portion
21 VDD
22 VSS
23 VSL
30 Logic substrate
31 Clamp circuit
33 Read circuit
41 Arbitrary function circuit
42 Pixel control wire
51 Arbitrary DC voltage generation circuit
52 FD initialization voltage wire

The invention claimed is:

1. An imaging device, comprising:
a pixel substrate including pixel element circuitry;
a logic substrate including read circuitry configured to receive an output signal voltage from the pixel element circuitry; and
electrically-conductive material arranged between the pixel substrate and the logic substrate, wherein the electrically-conductive material is configured to transfer at least one reference voltage from the logic substrate to the pixel substrate, wherein the electrically-conductive material comprises a Cu—Cu bonding portion,
wherein the Cu—Cu bonding portion comprises a first Cu—Cu bonding element configured to transfer a first reference voltage from the pixel substrate to the logic substrate and a second Cu—Cu bonding element configured to transfer the output signal voltage from the pixel substrate to the logic substrate.

2. The imaging device of claim 1, wherein the Cu—Cu bonding portion comprises a third Cu—Cu bonding element configured to transfer a second reference voltage.

3. The imaging device of claim 2, wherein the Cu—Cu bonding portion further comprises a fourth Cu—Cu bonding element configured to transfer the second reference voltage, and the second Cu—Cu bonding element is arranged between the third Cu—Cu bonding element and the fourth Cu—Cu bonding element.

4. The imaging device of claim 1, wherein the second Cu—Cu bonding element is coupled to an analog-digital converter and wherein a part of the analog-digital converter overlaps a part of the pixel element circuitry.

5. The imaging device of claim 1, wherein the read circuitry is arranged below the second Cu—Cu bonding element.

6. The imaging device of claim 1, wherein the Cu—Cu bonding portion comprises a fifth Cu—Cu bonding element and wherein the logic substrate further includes pixel driving circuitry configured to provide a pixel driving voltage to a gate of a transfer transistor of the pixel element circuitry via the fifth Cu—Cu bonding element.

7. The imaging device of claim 6, wherein the pixel driving circuitry is configured to provide the pixel driving voltage to control an exposure timing of at least one pixel in the pixel element circuitry.

8. The imaging device of claim 1, wherein the Cu—Cu bonding portion comprises a sixth Cu—Cu bonding element and wherein the logic substrate further includes reset voltage generation circuitry configured to provide a reset voltage to a gate of a reset transistor of the pixel element circuitry via the sixth Cu—Cu bonding element.

9. The imaging device of claim 1, wherein the Cu—Cu bonding portion is formed in an area of less than 15 μm×15 μm.

10. The imaging device of claim 9, wherein the Cu—Cu bonding portion is formed in an area of approximately 2 μm×2 μm.

11. The imaging device of claim 1, wherein the Cu—Cu bonding portion is configured to bond the pixel substrate to the logic substrate at a ratio of N:M, where N is a number of bonds electrically connected to the pixel substrate and M is a number of bonds electrically connected to the logic substrate.

12. The imaging device of claim 11, wherein N=1 and M=1.

13. The imaging device of claim 11, wherein N=1 and M>1.

14. The imaging device of claim 11, wherein N>1 and M>1.

15. The imaging device of claim 1, wherein the logic substrate further includes a vertical signal line arranged to receive the output signal voltage from the pixel element circuitry and clamp circuitry configured to control a voltage on the vertical signal line.

16. The imaging device of claim 1, wherein the pixel substrate comprises a first wiring layer formed near a lower surface of the pixel substrate, the logic substrate comprises a second wiring layer formed near an upper surface of the logic substrate, and wherein the electrically-conductive material is configured to electrically connect at least a portion of the first wiring layer and the second wiring layer.

17. The imaging device of claim 1, wherein the pixel element circuitry includes a plurality of N×M pixel blocks, and wherein the electrically-conductive material comprises a plurality of bonding points, each of which is configured to transfer at least one reference voltage from the logic substrate to each of the plurality of N×M pixel blocks.

* * * * *